United States Patent [19]
Domen et al.

[11] Patent Number: 5,860,106
[45] Date of Patent: Jan. 12, 1999

[54] METHOD AND APPARATUS FOR DYNAMICALLY ADJUSTING POWER/PERFORMANCE CHARACTERISTICS OF A MEMORY SUBSYSTEM

[75] Inventors: Stanley J. Domen, Roseville; Dileep R. Idate, Folsom; Stephen H. Gunther, Vacaville; George Thangadurai, Folsom, all of Calif.

[73] Assignee: Intel Corporation, Santa Clara, Calif.

[21] Appl. No.: 502,094

[22] Filed: Jul. 13, 1995

[51] Int. Cl.⁶ .................................. G06F 9/38; G06F 1/32
[52] U.S. Cl. .......................... 711/137; 711/204; 711/213; 711/118; 711/154; 364/707; 365/227; 395/750.03; 395/750.05; 395/750.06
[58] Field of Search ........................... 365/227; 395/449, 395/750, 432, 438, 494, 486, 750.02, 750.03, 750.05, 750.06, 750.07, 750.01; 711/204, 213, 3, 154; 364/707

[56] References Cited

U.S. PATENT DOCUMENTS

| | | | |
|---|---|---|---|
| 5,018,061 | 5/1991 | Kishigami et al. | 711/3 |
| 5,029,126 | 7/1991 | Yamaguchi | 365/49 |
| 5,396,059 | 3/1995 | Teates | 250/214 C |
| 5,418,839 | 5/1995 | Knuth et al. | 455/464 |
| 5,430,683 | 7/1995 | Hardin et al. | 365/227 |
| 5,506,976 | 4/1996 | Jaggar | 395/585 |
| 5,550,774 | 8/1996 | Brauer et al. | 395/750.06 |
| 5,640,532 | 6/1997 | Thome et al. | 711/128 |
| 5,651,130 | 7/1997 | Hinkle et al. | 711/105 |
| 5,669,003 | 9/1997 | Carmean et al. | 395/750.04 |
| 5,682,515 | 10/1997 | Lau et al. | 711/128 |
| 5,717,892 | 2/1998 | Oldfield | 711/128 |
| 5,727,180 | 3/1998 | Davis et al. | 365/49 |
| 5,737,746 | 4/1998 | Hardin et al. | 711/118 |

OTHER PUBLICATIONS

Steven A. Przybylski, "Cache and Memory Hierarchy Design" 1990, Morgan Kaufmann Publishers, INC.

*Primary Examiner*—Eddie P. Chan
*Assistant Examiner*—Hong C. Kim
*Attorney, Agent, or Firm*—Blakely, Sokoloff, Taylor & Zafman

[57] ABSTRACT

An apparatus and method for dynamically adjusting the power/performance characteristics of a memory subsystem. Since the memory subsystem access requirements are heavily dependent on the application being executed, static methods of enabling or disabling the individual memory system components (as are used in prior art) are less than optimal from a power consumption perspective. By dynamically tracking the behavior of the memory subsystem, the invention predicts the probability that the next event will have certain characteristics, such as whether it will result in a memory cycle that requires the attention of a cache memory, whether that memory cycle will result in a cache memory hit, and whether a DRAM page hit in main memory will occur if the requested data is not in one of the levels of cache memory. Based on these probabilities, the invention dynamically enables or disables components of the subsystem. By intelligently adjusting the state of these components, significant power savings are achieved without degradation in performance.

16 Claims, 8 Drawing Sheets

|  |  | Strong Cache Hit | Weak Cache Hit | Weak Cache Miss | Strong Cache Miss |
|---|---|---|---|---|---|
| Strongly Busy | Performance | A-A | A-A | A-E | A-E |
| Weakly Busy | Performance | A-A | A-A | A-E | A-E |
| Weakly Idle | Performance | A-E | A-E | A-E | E-E |
| Strongly Idle | Performance | E-E | E-E | E-E | E-E |
|  |  |  |  |  |  |
| Strongly Busy | Power Saving | A-A | A-E | A-E | A-E |
| Weakly Busy | Power Saving | A-E | A-E | A-E | A-E |
| Weakly Idle | Power Saving | E-E | E-E | E-E | E-E |
| Strongly Idle | Power Saving | E-E | E-E | E-E | E-E |

FIGURE 9a

|  |  | Strong DRAM Page Hit | Weak DRAM Page Hit | Weak DRAM Page Miss | Strong DRAM Page Miss |
|---|---|---|---|---|---|
| Strongly Busy | Performance | RA | RA | RA | RA# |
| Weakly Busy | Performance | RA | RA | RA | RA# |
| Weakly Idle | Performance | RA | RA | RA | RA# |
| Strongly Idle | Performance | RA# | RA# | RA# | RA# |
|  |  |  |  |  |  |
| Strongly Busy | Power Saving | RA | RA | RA | RA |
| Weakly Busy | Power Saving | RA | RA | RA | RA |
| Weakly Idle | Power Saving | RA | RA | RA | RA |
| Strongly Idle | Power Saving | RA# | RA# | RA# | RA# |

FIGURE 9b

METHOD AND APPARATUS FOR DYNAMICALLY ADJUSTING POWER/PERFORMANCE CHARACTERISTICS OF A MEMORY SUBSYSTEM

FIELD OF THE INVENTION

The invention relates to power management in computer memory subsystems. More specifically, the invention relates to a method for intelligently balancing between the power consumption and performance of a computer memory subsystem.

RELATED ART

For many years, memory caching has been a common way to improve a computer's performance characteristics. A cache memory is a block of very fast local storage memory usually made up of static RAM (SRAM) used by a microprocessor to hold copies of frequently used data or code. Modem computer systems typically contain one or more level of cache memory, which exist for the sole purpose of increasing the performance of the computer system. For computers with more than one level of cache memory, the level one (L1) cache memory is logically closer to the CPU than the second level cache memory (if it exists); the level two (L2) cache memory is logically closer to the CPU than the third level cache memory, etc. In most modem microprocessors, the L1 cache memory is typically on the same integrated circuit as the microprocessor, and is normally smaller and faster than an L2 cache memory, which may be located on a separate integrated circuit In systems employing a level one cache memory, the primary level one cache memory filters most memory references from ever being seen by the rest of the memory subsystem. The size of the level one cache memory is limited (especially in cases where it is integrated with the CPU core) by silicon cost, electrical loading constraints, and available chip space. Thus, larger programs frequently result in CPU memory requests that must be serviced by the remainder of the memory subsystem. When a memory reference that cannot be serviced by the L1 is initiated, the L2 tag array identifies whether the data or code requested is available in the L2 data cache memory. When an L2 cache memory hit occurs, the memory reference is satisfied by the L2 cache memory data array. If an L2 cache memory miss occurs, main memory is accessed. Without a second level of caching, all memory accesses that result in L1 cache misses would go to main memory, which is quite slow in comparison with modern CPU execution speeds. By employing a second level of caching larger than the first, performance is significantly improved by reducing the number of accesses to main memory.

To minimize the time required to make the hit/miss decision, the memory chips comprising the cache memory tag array are kept in an active condition by holding the chip enable signals in the active state. In a similar manner, the chip select signals for the cache memory data array are activated immediately after a memory access is initiated, without waiting for the hit/miss decision from the tag array/cache memory controller. Power consumption when the chips are enabled is an order of magnitude higher than when the chip is not enabled for typical SRAMs, thus, maintaining the chip in the active condition results in a significant power penalty. It is important to note that some multi-way associative cache memory designs only activate a single cache way for each cache memory access. Only enabling one cache way lowers the total power consumed by the data cache memory array somewhat, since not all data cache memory chips are activated for every cache memory access. However, these designs are static in that they always wait to determine which way of the cache memory is being accessed before activating the data cache memory chips. Since this decision takes time to make, it impacts the access time requirements and, therefore, the performance of the cache memory chips.

The main memory is usually implemented using DRAMs. Accessing a specific memory location within a DRAM usually requires generation and presentation of the row address, a wait period for this address to be latched by the DRAM, and then presentation of the column address. Because providing the row address and waiting wastes a significant amount of time if multiple sequential accesses to a single row are requested, prior art systems employ page access mode wherein the row address strobe (RAS) is held active. Maintaining RAS active tells the memory that until RAS is de-asserted, no other row will be accessed, thus allowing accesses to multiple columns within the row at a significant time savings. Since this mode requires more of the DRAM chip to remain active, it also results in higher power consumption, as with SRAM, DRAM requires more power in the active state.

An alternate system employed where power consumption is a major concern is to deassert RAS after each access, effectively assuming that there will be no additional main memory accesses for some extended time period. While this may be an effective strategy for application workloads which have few accesses to main memory, it can significantly increase both the execution time and power consumption of applications which exhibit frequent main memory accesses. Each time the RAS signal is de-asserted, there is a set time period (RAS pre-charge time) which must elapse before RAS can be re-asserted. It also takes time to generate the row address and assert RAS. The combination of these two time penalties may result in significant degradation of performance for programs that have many successive main memory accesses. Repeated assertion and de-assertion of RAS can also result in a power consumption penalty, since more power is required to assert RAS separately for two cycles than to assert RAS once and hold it active for both cycles.

Significantly, the above prior art systems use cache memory and enhanced DRAM capabilities to improve performance without regard for power consumption. In view of the foregoing, it is desirable to find a way to improve the power consumption characteristics of the memory subsystems without significantly degrading performance.

SUMMARY OF THE INVENTION

The instant invention provides an apparatus and method for dynamically adjusting the power/performance characteristics of a memory subsystem. Since the memory subsystem access requirements are heavily dependent on the application being executed, static methods of enabling or disabling the individual memory system components (as are used in prior art) are less than optimal from a power consumption perspective. By dynamically tracking the behavior of the memory subsystem, the invention predicts the probability that the next event will have certain characteristics, such as whether it will result in a memory cycle that requires the attention of a cache memory, whether that memory cycle will result in a cache memory hit, and whether a DRAM page hit in main memory will occur if the requested data is not in one of the levels of cache memory. Based on these probabilities, the invention dynamically enables or disables components of the subsystem. By intelligently adjusting the state of these components, significant power savings are achieved without degradation in performance.

DESCRIPTION OF THE DRAWINGS

FIGS. 9a and b are sample tables of the modes in which the invention might operate the memory subsystem for every state depicted in FIGS. 4a–c.

DETAILED DESCRIPTION OF THE INVENTION

The present invention provides a method and apparatus for dynamically managing the power/performance characteristics of memory subsystems. For purposes of explanation, specific details are set forth to provide a thorough understanding of the present invention. However, it will be understood by one skilled in the art that the invention may be practiced without these details. Moreover, well-known elements, devices, process steps and the like are not set forth in order to avoid obscuring the invention.

Figure 1:
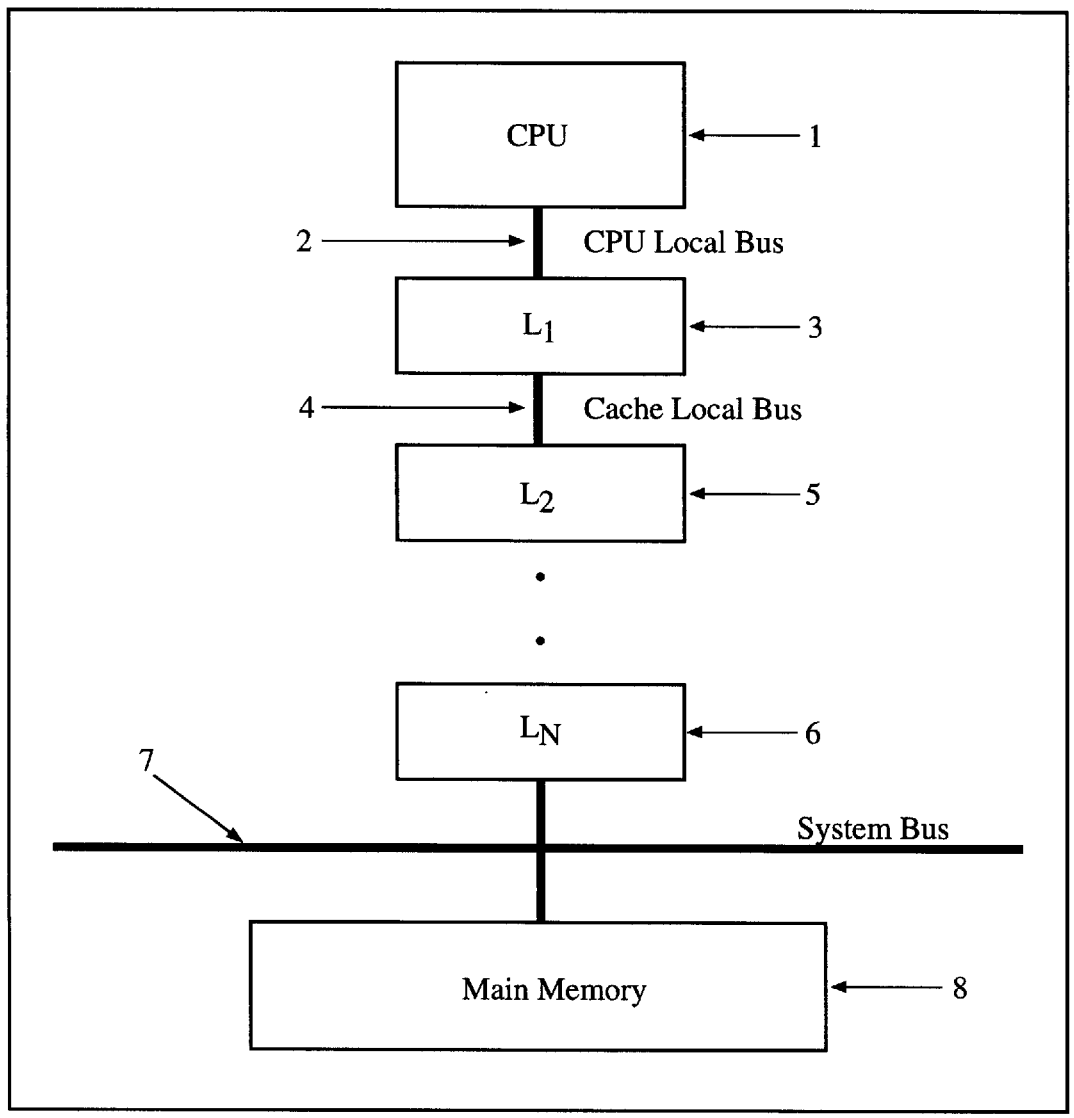
FIG. 1 is a block diagram of prior art systems employing one or more levels of cache memory.

FIG. 1 shows a prior art system implementing one or more levels of cache memory. Specifically, CPU 1 communicates with the first level of cache memory 3 via CPU local bus 2. The first level of cache memory 3 then communicates with a subsequent cache memory 5 via the cache local bus 4. Each level of cache memory communicates with the cache memory logically below in this same way until the final level of cache memory 6 then communicates with main memory 8 via the system bus 7. The prior art shown in FIG. 1 utilizes the cache memory subsystem as a means of enhancing speed of memory access, and makes no attempt to control the power consumption of either the cache memory or any memory subsystem.

Figure 2:
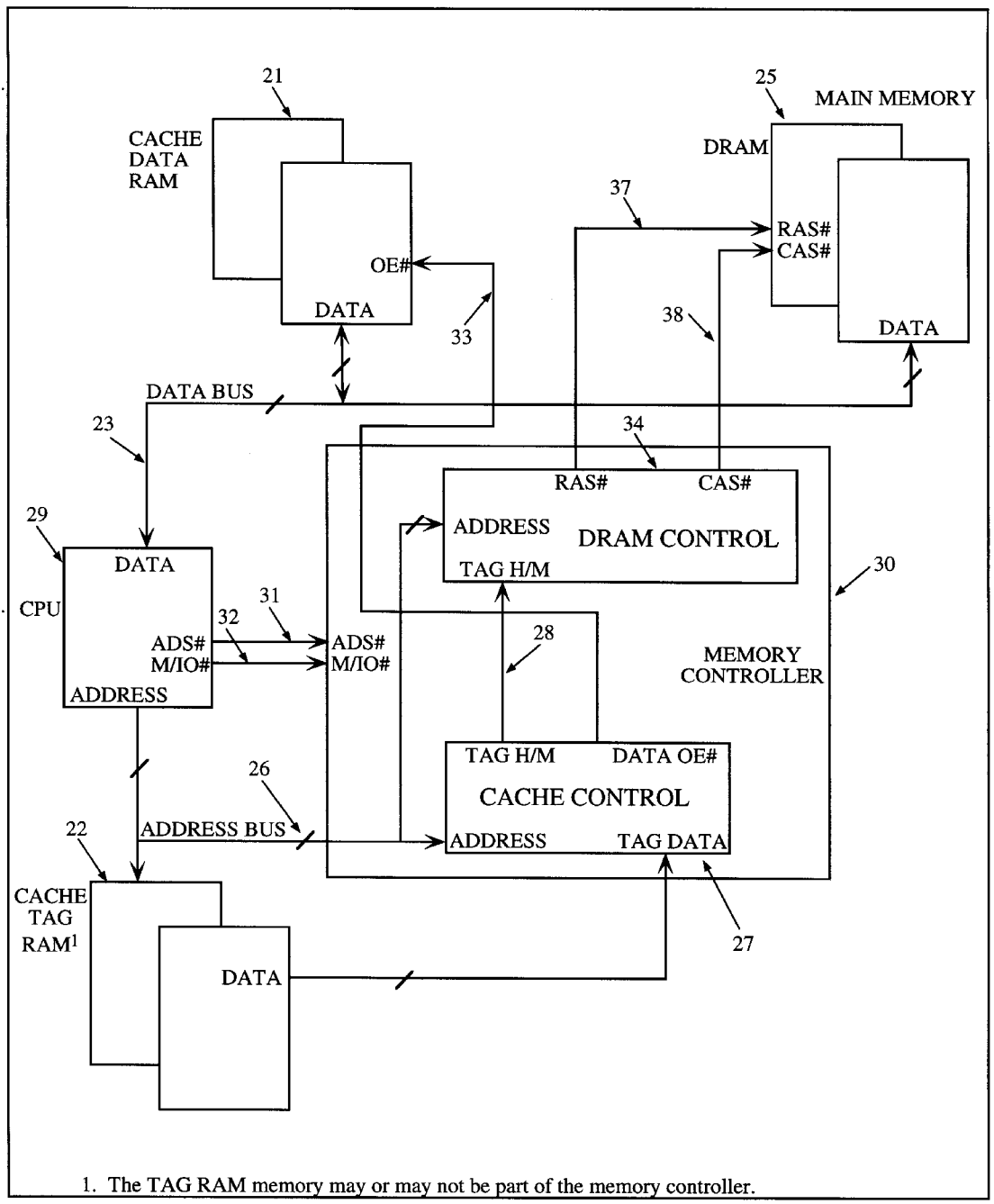
FIG. 2 is a block diagram of a prior art system employing a cache memory including a memory controller logic.

FIG. 2 shows a prior art system employing a cache memory. More specifically, FIG. 2 shows the internal workings of a cache/memory controller situated between CPU 29 and main memory 25. The cache memory consists of a cache data RAM 21, a cache tag RAM 22, and cache control logic 27. When the CPU 29 requests data, the cache control logic 27 compares the address of the data in main memory which is provided by the CPU 29 along address bus 26 with the addresses stored in the cache tag RAM 22, such addresses corresponding to the data in the data cache memory 21.

Based on this comparison, hit or miss decision 28 is made. If there is a cache memory hit, the requested data is sent from the cache data memory 21 along data bus 23 to CPU 29, and the cache memory controller terminates the main memory access which was simultaneously initiated by providing the address along address bus 26 which communicates with main memory 25. Conversely, if a cache memory miss occurs, the memory access proceeds uninterrupted and the main memory 25 provides the data to the CPU 29 along data bus 23. Further, depending on the cache memory replacement algorithm, such data may be added to that stored within the data cache memory 21. Significantly, the above routine applies regardless of the number of layers of cache memory between the CPU 29 and main memory 25.

Figure 3:
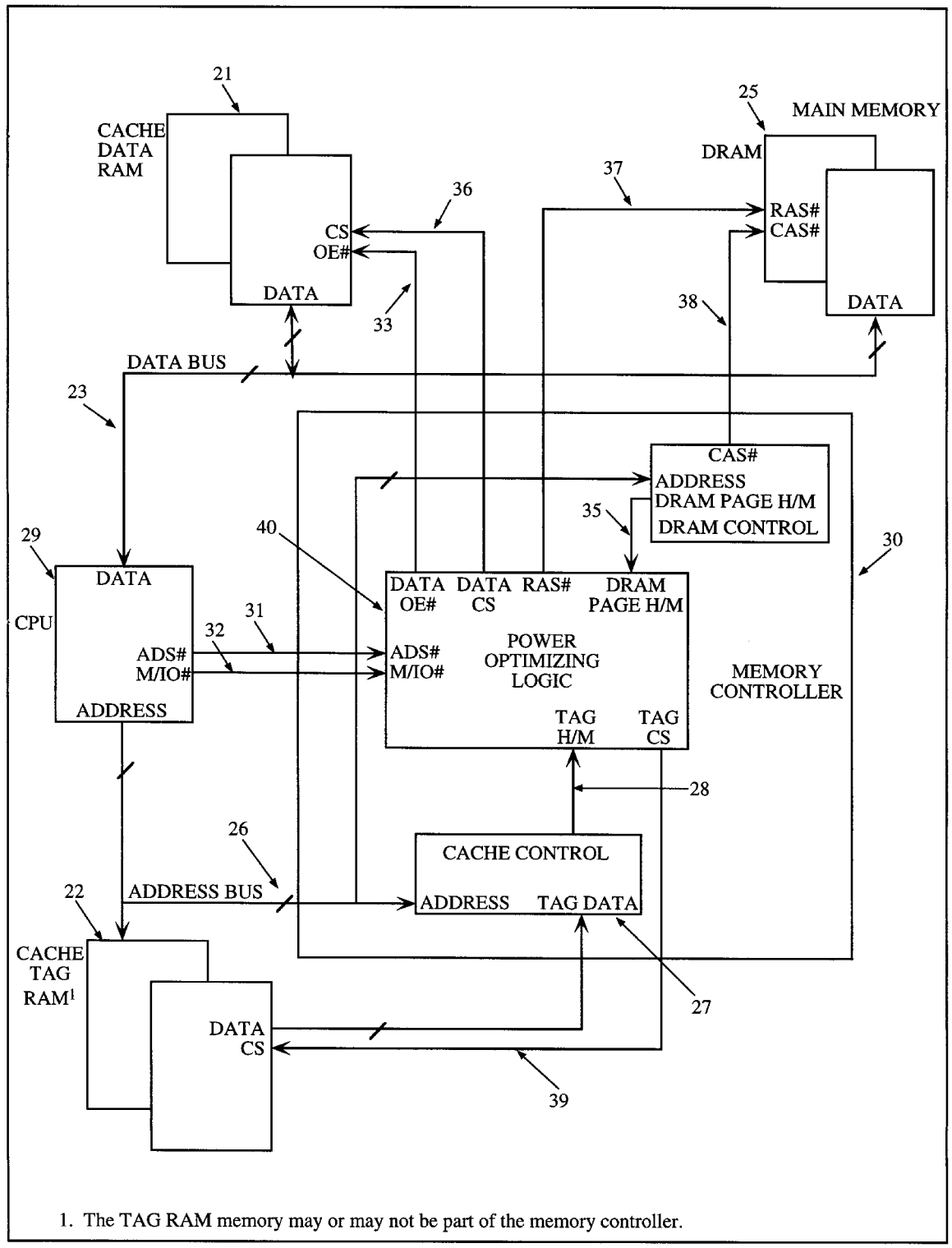
FIG. 3 is a block diagram of one embodiment of a computer system incorporating the invention into the memory controller.

FIG. 3 shows a computer system incorporating the instant invention into the memory subsystem controller 30. In the instant invention, the CPU 29 provides an address strobe 31 and a memory/IO access signal 32 to power optimization logic 40 of the memory controller 30. The power optimizing logic 40 is thereby able to track the total number of clock cycles elapsed versus the number of clock cycles in which off chip memory accesses occur, including accesses of either cache memory or main memory. Further, cache control logic 27 provides the hit and miss decision 28 to the power optimizing logic 40. The power optimizing logic 40 uses this information to predict the likely target of the next CPU memory request. Based on this algorithm, the power optimizing logic 40 enables or disables the chip select 39 of the cache tag RAM 22, as well as the chip select 36 of the cache data RAM 21. Finally, the DRAM controller 34 of the memory controller 30 provides the DRAM page hit and miss information 35 to the power optimizing logic 40. In view of this and the other above mentioned inputs, power optimizing logic 40 asserts or de-asserts the row address strobe (RAS) 37 (which is essentially the chip select for the DRAM), thereby keeping the DRAM's in the page mode (RAS asserted) or single access (RAS de-asserted) mode.

Figure 4A:
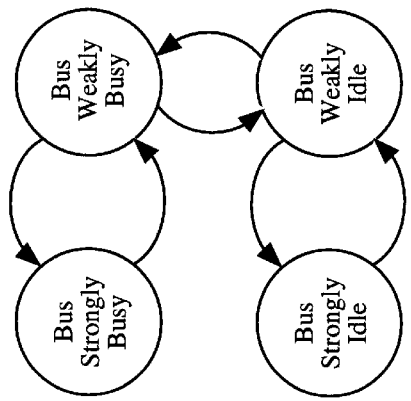
FIGS. 4a–c are state diagrams corresponding to selected system events tracked by the present invention.
Figure 4B:
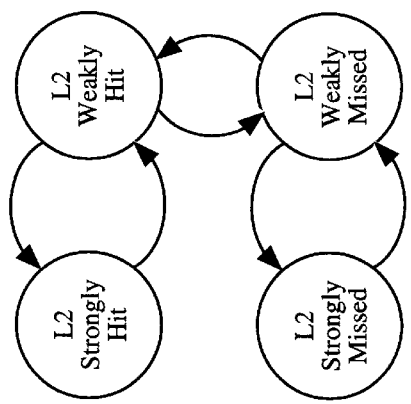
Figure 4C:
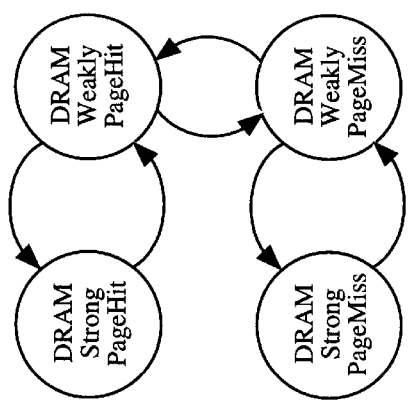

Now referring to FIGS. 4a–c which are state diagrams reflecting the tracking of three types of events: CPU bus utilization, cache memory hit probability, and probability of a page hit in main memory, respectively. Based on the state of these probabilities, the tag and data cache memories will be either in an "active mode" or an "event driven mode", and the RAS will be either active or inactive. Active mode refers to the condition where the necessary control signals are held continuously in the active state, and the corresponding memory component is in a high state of readiness. This effectively reduces the time required to accomplish an event, since there is no delay in driving these signals active. Event driven refers to the condition where the necessary control signals are not held active, but rather they are asserted and de-asserted as necessary based on the power/performance requirements of the memory subsystem. As conditions change, the power optimizing logic will automatically adjust the subsystem component modes to achieve the preferred power/performance trade-off.

In the active mode, the chip select for the tag cache memory is always enabled, and the chip select for the data cache memory is enabled immediately upon recognition of a memory cycle (i.e., before the hit/miss decision is made). While this enhances performance, it comes at the power penalty discussed above in connection with prior art systems. It is, of course, possible and, as discussed below, in some cases desirable to have the tag cache memory in an active mode and the data cache memory in an event driven mode.

If either the tag or data cache memory is in event driven mode, the chip select of the respective cache memory is disabled until a triggering "event" occurs. In the case of the tag cache memory, the event is any memory access (e.g. cache memory or main memory access). In the case of a data cache memory, the event is a cache memory hit in the particular data array. Since cache memories are implemented in SRAM, deasserting the chip select signal reduces power consumption an order of magnitude over the power consumed in cases where chip select is always asserted.

It will be noted that the page access mode of the DRAM in main memory functions similar to that of a cache memory. Thus, the instant invention is envisioned to include operating the DRAM in either event driven mode or active mode with the power/performance characteristic being optimized based on tracked criteria. An access to the main memory DRAM requires a row address and a column address. Each time RAS is asserted, the CPU must wait while the DRAM selects the correct row before the column address strobe (CAS) can be asserted and the data retrieved. This is known as the RAS access time. In the page access DRAM mode, RAS remains asserted between accesses to the DRAM. This improves performance where multiple memory accesses result in page hits because the column address can be directly applied to the DRAM. However, performance degrades in the event that accesses commonly result in page misses because of the time penalty required to de-assert RAS, wait out a RAS precharge time period, and then initiate a RAS/CAS access. It should be clear that the main memory power/performance trade-off is not dependent on implementing main memory in DRAM; any memory system having distinct levels of power consumption can be optimized employing the instant invention.

As a further consideration, continually asserting RAS represents a substantial power drain. However, there is also a power penalty paid if RAS is toggled with unnecessary frequency. This power penalty is the result of the fact that it requires more power on a clock by clock basis to assert RAS than to maintain RAS active once asserted. Therefore, in determining whether to have RAS active or inactive, one must evaluate the frequency of page hit, the frequency of off-chip memory access, as well as the system parameters which contribute to precharge penalty and the power penalty of switching discussed above. For example, if the power cost of running the RAS active is I unit/cycle, and the cost of asserting is 10 units, assuming a page hit is likely, it would be desirable from both a power and performance perspective to leave RAS active if a main memory access is likely to occur within the next 10 cycles. Conversely, if a main memory access is not likely to occur within the next 10 cycles, power can be saved by de-asserting RAS at a performance cost equal to the difference between the RAS access time and the CAS access time.

As mentioned earlier, three parameters, namely, Bus Utilization (BU), cache memory hit rate probability and DRAM page hit probability are necessary to design the power optimizing logic. The parameters can be tracked by using simple state machines, such as, for instance, those shown in FIGS. 4a to 4c. These state machines are used to predict the likely result of future accesses. FIGS. 4a to 4c illustrate state machines that track bus utilization, cache hit probability and the DRAM page hit probability respectively. Each one shows four states. For BU they are strongly idle, weakly idle, weakly busy, and strongly busy. For the cache memory and DRAMs they are strongly hit, weakly hit, weakly miss and strongly miss. The number of states may be arbitrarily selected based on the desired level of granularity in the parameter tracking. However, for the sake of illustration, the selection of four states is desirable. The strong idle state signifies that very few accesses are being made to the memory subsystem. The reason may be that the CPU itself is idle or the memory level (or levels) before the current one, if any, in the memory hierarchy is fulfilling most of the CPU's requests. The weakly idle state means that the number of accesses has increased but still are less than some predetermined threshold. The weakly busy state means that the number of accesses are now substantial but are not in a predetermined peak region yet. Lastly, the strongly busy state suggests that the number of memory accesses have entered the peak region. Selection of the transition points between states is discussed more fully below. The same reasoning applies to both the cache Hit/Miss situation and the DRAM Page Hit/Miss situation.

Figure 5A:
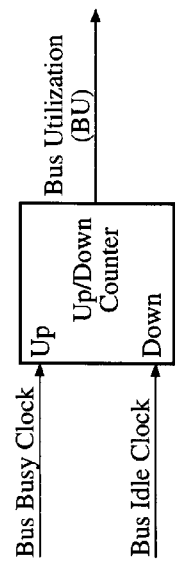
FIGS. 5a–c are block diagrams of one embodiment of counters which can be employed in the invention to track the relevant events.
Figure 5B:
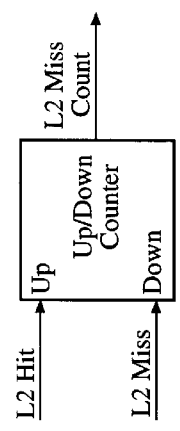
Figure 5C:
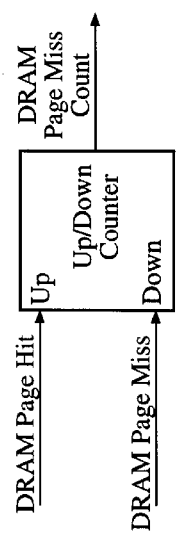

Each of these state machines are driven by a simple dedicated up/down counter. These counters are illustrated in FIG. 5a to 5c. The BU counter counts up for every bus clock during which an access is occurring to the associated memory sub-system. The idle bus clocks drive the counter down. The Cache Miss counter counts up whenever an access results in a miss to the cache memory and counts down if an access results in a cache memory hit. The DRAM Page Miss counter counts up if a page miss occurs and counts down if a page hit occurs.

It is desirable to use saturating counters. The upper limit on the count is determined by the number of bits used in the counter. For example a 4-bit counter will count from 0 to 15 and will saturate at 15 if counting upwards and at 0 if counting downwards. The output count of the counter is used to determine the current state of the state machines. The width of the counters (number of bits used) can be arbitrarily selected based upon different factors such as maximum access time and the workload characteristics on a given system. Transition points for the state changes (the count at which a particular state transition occurs) in the state machines are also decided by the type of power/performance tradeoffs desired in a particular system. For example, it may be decided based on the desired performance/power tradeoffs that if 70 to 100% of accesses result in the cache memory hit, then it is called strongly hit region, 50~70% being weakly hit, 30~50% being weakly miss and 0~30% of hit rate being a strongly miss region. An example partitioning is discussed more fully below in connection with FIGS. 8a and b. It should also be noted that the state transitions on opposite direction between a pair of states need not occur at the same count but can occur on different counts, thereby introducing 'hysterisis'. A person skilled in the area of instant invention should be able to comprehend the benefits of hysterisis.

Figure 6A:
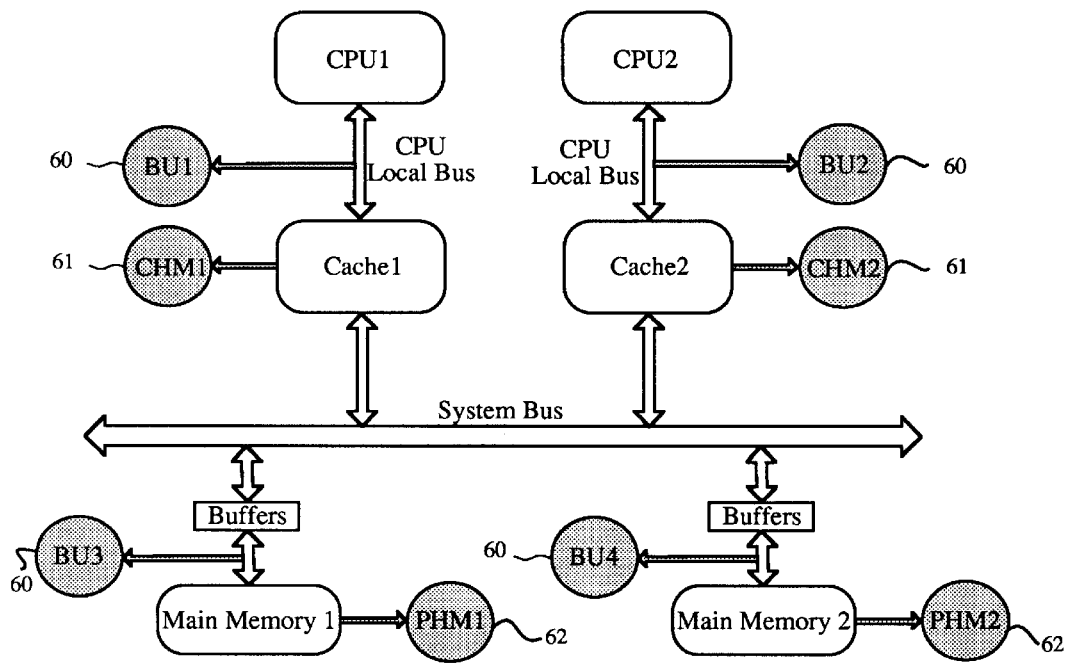
FIGS. 6a–c show modular incorporation of the invention in various system configurations.
Figure 6B:
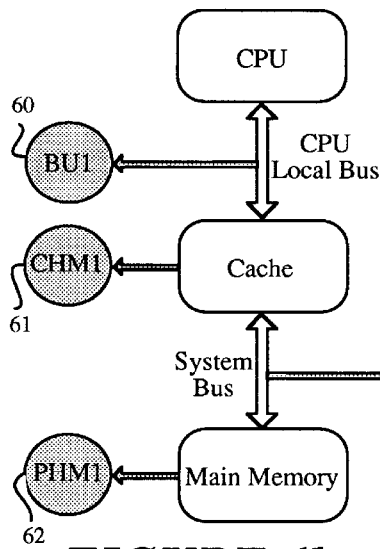
Figure 6C:
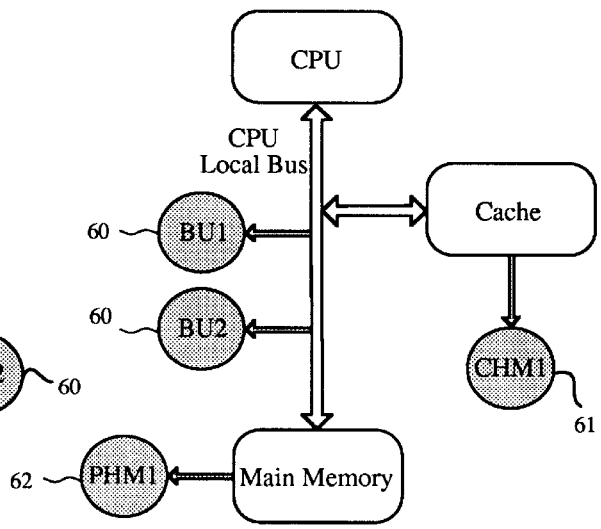

Thus, a state machine and its corresponding counter make a module that monitors the desired parameter. These modules are illustrated in FIGS. 6a–c as circles 60–62. These figures show three type of systems: FIG. 6a is a generic multiprocessing system, FIG. 6b is a single CPU system with a serial cache memory and FIG. 6c shows a single CPU system with a parallel cache memory. The modules for measuring Bus Utilization are named as BUn, where n is a number and are connected to the bus they are monitoring, the ones for Cache Hit/Miss Probability are named CHMn and those for DRAM Page Hit/Miss are PMHn and these are also shown connected to their respective part of the memory hierarchy (cache memory or main memory).

In the FIG. 6a, each of the two CPUs have a BU module on its local bus which is also the bus for cache memory interface. Each of the cache memories have their own module for tracking Hit and Miss. The data from the BU1/2 and CMH1/2 are used for tuning the power/performance characteristics of the cache memories 1/2. The way to do this is explained later. This system has two main memories. Each one is separated from the system bus by buffers. Each one needs its own modules to track the BU and the Page Hit/Miss rate. For example, BU3 tracks the Bus Utilization at the port of Main Memory 1 and the PHM1 tracks its Hit/Miss rate. The data from these two modules is used to tune the power/performance characteristics of Main Memory 1.

FIG. 6b shows a single CPU system having a serial cache memory. The memory accesses for cache memory are tracked by BU1 and CHM1, while that for the Main Memory is tracked by BU2 and PHM1 modules. Note that if there were more levels of cache memories in this system, each cache memory level will have a BU and a CHM module. It should also be noted that each level in the memory subsystem, whether it is a cache memory or DRAM memory, can be independently power optimized with the help of the data tracked by its corresponding pair of modules.

FIG. 6c shows a cache subsystem in parallel with main memory. In this case, the main memory and the cache memory attach to the same physical bus. We can still have two BU modules where the BU1 will track total bus utilization and BU2 will track only the part of bus utilization that is used for accessing main memory. This can be achieved by simply enabling the upward counting of BU2 with a miss signal from the cache memory. An alternate way is just to have BU1 and not have BU2 at all. In this case, the bus utilization for the main memory port can be deduced from the BU1 count and the cache memory miss rate counted by CHM1. This saves one module (BU2) at the cost of increase in complexity of logic for optimizing the main memory; since three parameters: BU1, CHM1 and PMH1 must now be considered instead of two (BU2 and PMH1).

Figure 7A:
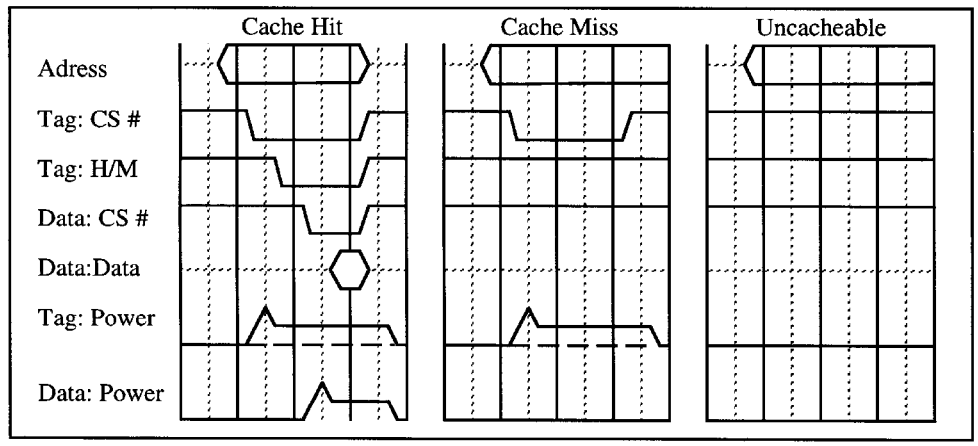
FIGS. 7a–c are timing diagrams showing cache memory activity in active and event driven modes that occur in one embodiment of the present invention.
Figure 7B:
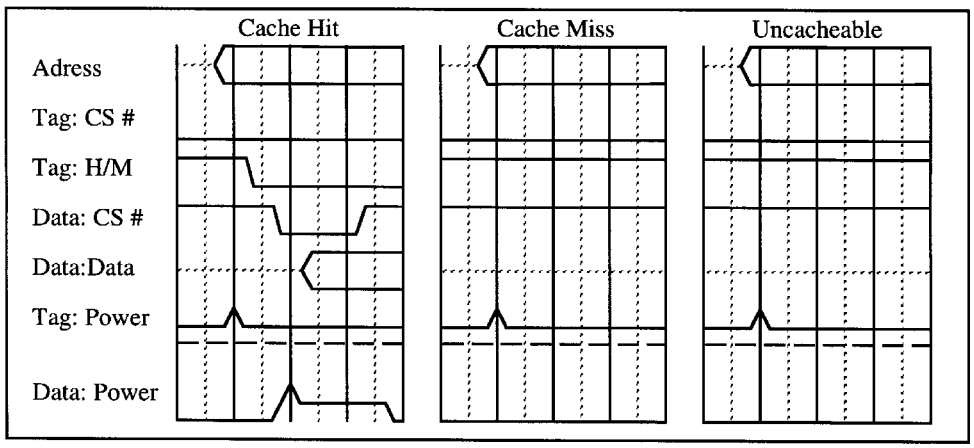
Figure 7C:
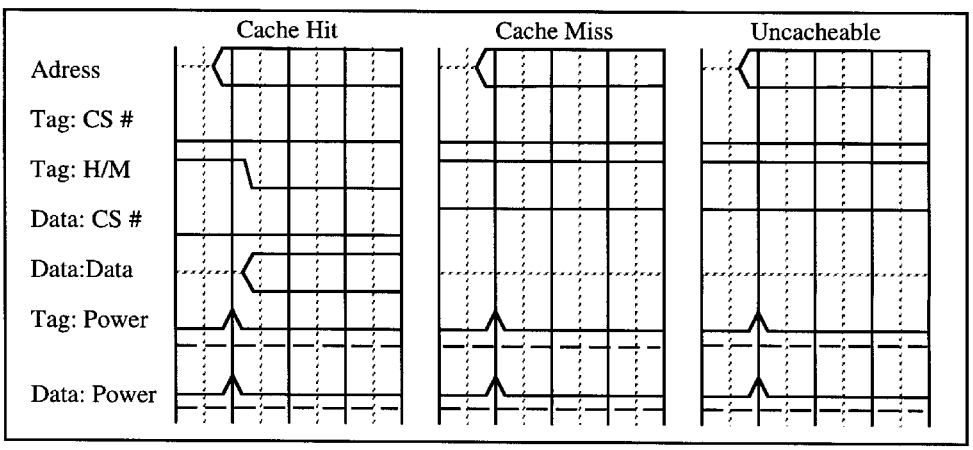

Management of cache memory power consumption is performed by selection of a high performance-high power mode or of a moderate performance-low power mode. The modes of operation are called "Active Mode" and "Event Driven Mode". FIGS. 7a–c are timing diagrams which will clarify the distinction between Active Mode and Event Driven Mode in the context of the Tag Cache memory and Data Cache memory. Event Driven Tag Cache memory is shown in FIG. 7a where the Tag:CS signal is asserted after the Address is decoded and determined to be a possible Cache memory access. Event Driven Data Cache memory is also shown in FIG. 7a where the Data:CS signal is asserted after the Tag:H/M (Hit/Miss) signal indicates an Cache Hit. Note that for Uncacheable cycles, neither Tag:CS nor Data:CS are asserted, thus saving power.

Figure 8A:
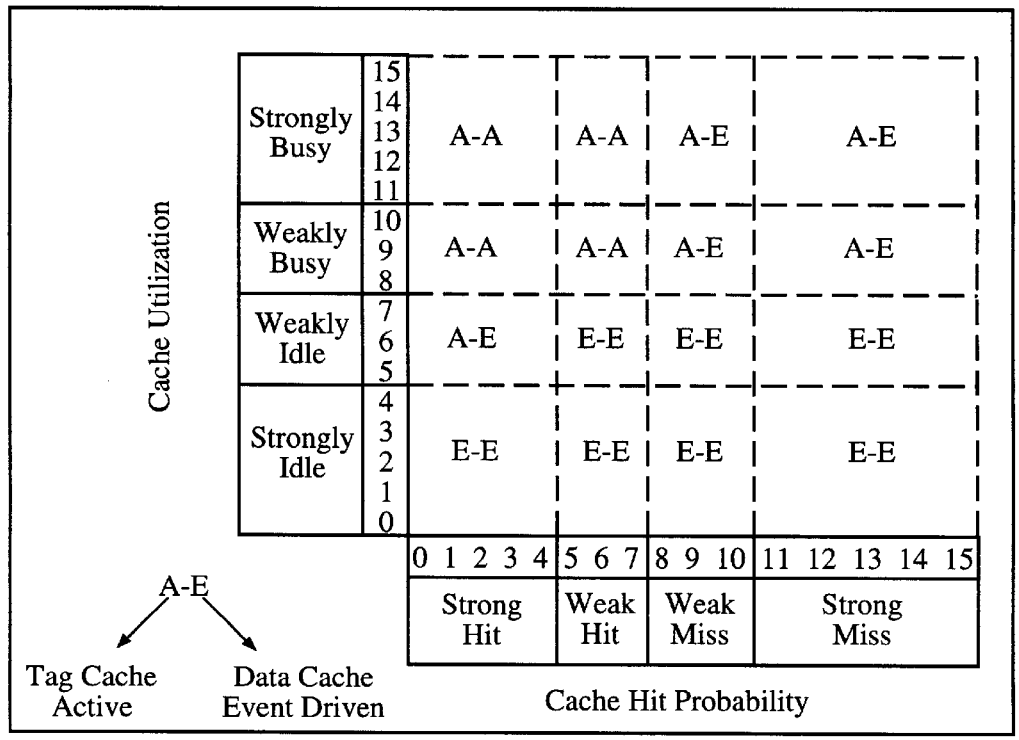
FIGS. 8a–b are matrices showing cache and main memory modes of operation based on tracked parameters in one embodiment of the invention.
Figure 8B:
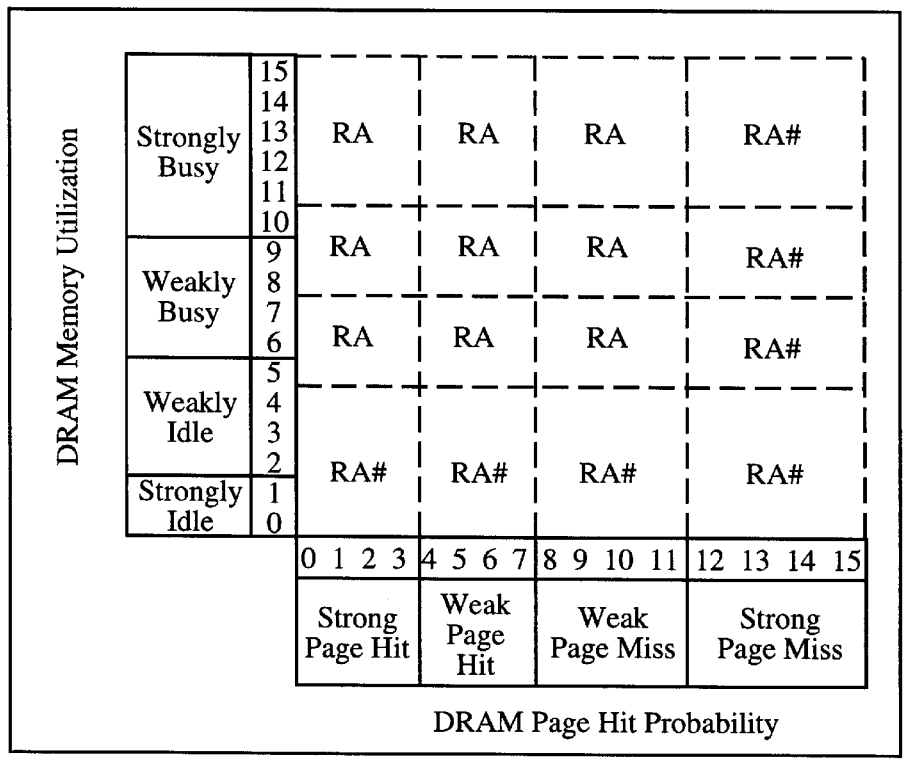

FIG. 7a shows the power consumption when both the Tag and Data cache memory are Event Driven. Note that the power consumption approaches zero when the chip select signals are inactive. When the memory bus is inactive (or idle), power use is minimized. However, performance may degrade in this mode as the Tag look up and Data access are serialized. FIG. 7b shows the power consumption when the Tag cache memory is kept Active, but the Data cache memory is Event Driven. There is good performance and good (but not optimal) power savings, the primary power savings benefit comes from the fact that the Data Cache memory is not accessed during Data Cache memory misses. FIG. 7c shows the best performance as both the Tag and Data Cache memories are always active. However, this solution has the highest power consumption as the Tag cache memory and Data Cache memory are both accessed in parallel before the Tag Cache memory "hit/miss" decision is made. The switching between modes can be performed by a variety of logic implementations added to existing memory control logic. From this disclosure, such would be clear to one of ordinary skill in the art The above discussed systems show just some of the many possible ways to monitor the required parameters for memory subsystem power/performance optimization. For the sake of illustration, assume that the State Machines in FIGS. 4a–c are implemented using 4-bit saturating, up/down counters. Since a two dimensional matrix is formed using pairs of state machines, a 16×16 matrix describes the 256 possible combinations. FIGS. 8a–b retains the resolution of the 4-bit counters and partitions the matrix in a nonsymmetric fashion. Selection criteria of the modes of operation within each cell of the matrix is a function of the workload profile and decision to optimize for either power savings or performance. Note that the use of 4-bit saturating up/down counters is merely a simple and inexpensive technique of determining probabilities based on past history, yet provides ample granularity for a wide variety of applications. Other techniques to record recent histories and to determine probabilities can be used without departing from the scope or contemplation of the instant invention.

FIG. 8a describes one way of partitioning a Cache memory matrix: Cache memory Utilization and Cache memory Hit probabilities have both been partitioned into four categories, yielding a matrix of 16 cells. Each cell of the matrix represents a workload as determined by the statistics of recent Cache memory history. Based on that workload, the invention dynamically configures the operating algorithm of the Cache memory subsystem. When there is a "Strongly Busy" and "Strong Hit" condition, the implication is that there are many Cache memory requests and that there is a high probability that the requests will be serviced by the Cache memory. Under these conditions, it is advantageous to configure the Cache memory for high performance. Similarly, when there is a "Strongly Busy" and "Strong Miss" condition, the implication is that there are many Cache memory requests but that there is a high probability that the requests will be serviced by other memory agents. Under these conditions, it is advantageous to keep the Tag Cache memory Active (to quickly determine Cache memory hit/miss) and keep the Data Cache memory in the Event Driven mode. This allows fast Cache memory hit/miss determination and at the same time does not unnecessarily consume power by the Data Cache memory. Within the matrix, there are a pair of letters: the first of the pair (on the left) represents the operating mode of the Tag Cache memory and the second of the pair (on the right) represents the operating mode of the Data Cache memory. An "A" represents Active Mode and an "E" represents Event Driven Mode.

FIG. 8b describes one way of partitioning DRAM matrix: DRAM Utilization and DRAM Page Hit probabilities have both been partitioned into four categories, yielding a matrix of 16 cells. Each cell of the matrix represents a workload as determined the statistics of recent DRAM access history. Based on that workload, the invention dynamically adjusts the operating algorithm of the DRAM memory subsystem. When there is a "Strongly Busy" and "Strong Page Hit" condition, the implication is that there are many DRAM requests and that there is a high probability that the requests will be serviced from the current DRAM memory page. Under these conditions, it is advantageous to configure the DRAM controller to be in the Active Page Mode. Similarly, when there is a "Strongly Busy" and "Strong Page Miss" condition, the implication is that there are many DRAM requests but that there is a high probability that the requests will be serviced from another DRAM page. Under these conditions, it is advantageous to deassert the DRAM RAS# signal as soon as possible and initiate the "DRAM RAS# Precharge cycle. This allows optimizing the DRAM memory subsystem for performance. "RA" represents RAS# Active Mode (RAS# is kept active until a DRAM Page Miss occurs) and RA# represents RAS# Inactive Mode (RAS# is deasserted after every DRAM Access).

Selection of the operating modes for each cell is based on power/performance trade offs of existing memory technologies. The invention manages dynamic selection of the various operating modes based on real time workload statistics. Accordingly, the operating mode may be adjusted in response to each bus cycle. FIGS. 9a–b show one possible selection of modes for both the Cache memory and DRAM matrices. There are two examples given: one for a performance oriented system and one for a power savings conscious system. It is envisioned that a user would be able to choose between performance oriented and power savings oriented optimizations (e.g. close calls in the trade-off scheme will fall toward selected orientation).

In the foregoing specification, the invention has been described with reference to specific embodiments thereof. It will, however, be evident that various modifications and changes made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A computer system comprising:

a processor;

a memory system including a cache;

at least one bus coupled to the memory system and to the processor; and an optimization logic that predicts a probability of an event in a memory subsystem wherein the optimization logic enables a tag array if the probability of the event reaches a first predetermined level, enables a data cache if the probability of the event reaches a second predetermined level and only enables the data cache if the event actually occurs if the probability of the event has not reached the second predetermined level.

2. The computer system of claim 1 wherein the optimization logic comprises:

a plurality of comparators; and a plurality of counters for tracking parameters coupled to the plurality of comparators which together predict the probability of an event in the memory subsystem wherein the parameters tracked include bus utilization and hit/miss occurrences for a portion of the memory subsystem.

3. The computer system of claim 1 wherein the memory subsystem comprises a main memory and the optimization logic dynamically enables a memory access mode to be one of page mode and single access mode base on a predicted probability of a second event.

4. A computer system comprising:

a processor;

a memory system;

at least one bus;

means for tracking behavior of a memory subsystem;

means for predicting the occurrence of an event in the memory subsystem based on the tracked behavior; and means for dynamically adjusting a mode of operation of the memory subsystem responsive to the predicting means wherein the means for dynamically adjusting enables a tag array if the probability of the event reaches a first predetermined level, enables a data cache if the probability of the event reaches a second predetermined level, and only enables the data cache if the event actually occurs if the probability of the event has not reached the second predetermined level.

5. A method of dynamically adjusting characteristics of a computer system having a processor coupled to a memory subsystem including a cache, comprising the steps of:

recording information of prior activity of the memory subsystem;

predicting a probability of a cache hit on a next transaction with the cache;

enabling a tag array if the probability of a cache hit reaches a predetermined level;

enabling a data cache if the hit probability reaches a second predetermined level; and enabling the data cache only if a hit actually occurs if the hit probability has not reached the second predetermined level.

6. The method of claim 5 wherein the memory subsystem comprises a memory organized in pages and wherein the method further comprises the steps of:

predicting a probability of a memory page hit on a next transaction; and enabling RAS active mode if the probability of a page hit exceeds a predetermined level.

7. The method of claim 6 wherein the processor has an internal cache, and wherein the method further comprises tracking a ratio of bus cycles to bus cycles during memory accesses.

8. The method of claim 5 wherein the system has a plurality of levels of cache and wherein the method further comprises the steps of:

tracking a ratio of bus cycles to bus cycles during which a particular level of cache is accessed;

tracking a ratio of cache hits to cache misses for the particular cache level; and setting the mode of the particular cache level operation based on the ratios.

9. The method of claim 5 wherein only a bank of the data cache containing the information is enabled responsive to a cache hit.

10. In a computer system having a CPU coupled to a memory by a bus, an apparatus for optimizing characteristics of a memory subsystem comprising:

means for recording behavior of the subsystem; and means for dynamically enabling portions of the memory subsystem in response to the recorded behavior wherein a tag cache is enabled if the recorded behavior indicates a first probability of an event, a data cache is enabled if the recorded behavior indicates a second probability of the event and the data cache is only enabled if the event occurs if the recorded behavior does not indicate the second probability of the event.

11. The apparatus of claim 10 wherein the means for recording comprises:

means for tracking the ratio of bus cycles to bus cycles during which a portion of the memory subsystem is accessed.

12. The apparatus of claim 10 wherein the means for recording comprises first means for predicting a probability of a cache hit; and wherein the means for dynamically enabling comprises means for dynamically setting a mode of cache operation responsive to the predicting means.

13. The apparatus of claim 12 wherein the means for dynamically enabling further comprises:

second means for predicting a probability of a page hit in main memory; and means for dynamically setting a mode of main memory operation responsive to the predicting means, second predicting means, and the tracking means.

14. The apparatus of claim 13 wherein the first and second predicting means comprise up-down counters coupled to comparators.

15. The apparatus of claim 12 wherein the dynamically setting means further comprises first means for enabling the tag cache; and second means for enabling the data cache.

16. The apparatus of claim 15 wherein the second enabling means can independently enable individual data arrays within the data cache.

* * * * *

UNITED STATES PATENT AND TRADEMARK OFFICE
CERTIFICATE OF CORRECTION

PATENT NO.    : 5,860,106
DATED         : January 12, 1999
INVENTOR(S)   : Domen et al.

It is certified that error appears in the above-identified patent and that said Letters Patent is hereby corrected as shown below:

Column 1,
Line 20, delete "Modem" and insert -- Modern --.

Signed and Sealed this

Seventeenth Day of June, 2003

JAMES E. ROGAN
*Director of the United States Patent and Trademark Office*